United States Patent [19]

Leacock et al.

[11] Patent Number: 5,398,060
[45] Date of Patent: Mar. 14, 1995

[54] MULTIPLEXED NOISE SUPPRESSION SIGNAL RECOVERY FOR MULTIPHASE READOUT OF CHARGE DEVICE ARRAYS

[75] Inventors: Thomas J. Leacock, Mt. Laurel; Joseph F. Hacke, Voorhees, both of N.J.

[73] Assignee: Panasonic Technologies, Inc., Princeton, N.J.

[21] Appl. No.: 164,623

[22] Filed: Dec. 7, 1993

Related U.S. Application Data

[63] Continuation of Ser. No. 828,726, Jan. 31, 1992, abandoned.

[51] Int. Cl.⁶ .............................................. H04N 3/14
[52] U.S. Cl. ..................................... 348/241; 348/250
[58] Field of Search ...................... 348/241, 250, 312

[56] References Cited

U.S. PATENT DOCUMENTS

| | | | |
|---|---|---|---|
| 4,413,284 | 11/1983 | Izumita et al. | 358/213.15 |
| 4,809,074 | 2/1989 | Imaide et al. | 358/213.15 |
| 4,941,052 | 7/1990 | Ohbo | 358/213.15 |
| 5,025,318 | 6/1991 | Nagura | 358/213.15 |
| 5,191,424 | 3/1993 | Nohmi et al. | 348/250 |

FOREIGN PATENT DOCUMENTS

| | | | |
|---|---|---|---|
| 1137783 | 5/1989 | Japan | H04N 5/335 |
| 3019479 | 1/1991 | Japan | H04N 5/335 |
| 3094586 | 4/1991 | Japan | H04N 5/335 |
| 3190476 | 8/1991 | Japan | H04N 5/335 |

*Primary Examiner*—Michael T. Razavi
*Assistant Examiner*—Wendy R. Greening
*Attorney, Agent, or Firm*—Amster, Rothstein & Ebenstein

[57] ABSTRACT

A noise suppression, signal recovery circuit for use with an array of charge coupled device having a plurality of phase readouts. The video information present in the multiple phases are combined into a single video output signal by using a minimal number of parts while providing for noise suppression designed to suppress typical noise present in charge coupled device arrays.

10 Claims, 5 Drawing Sheets

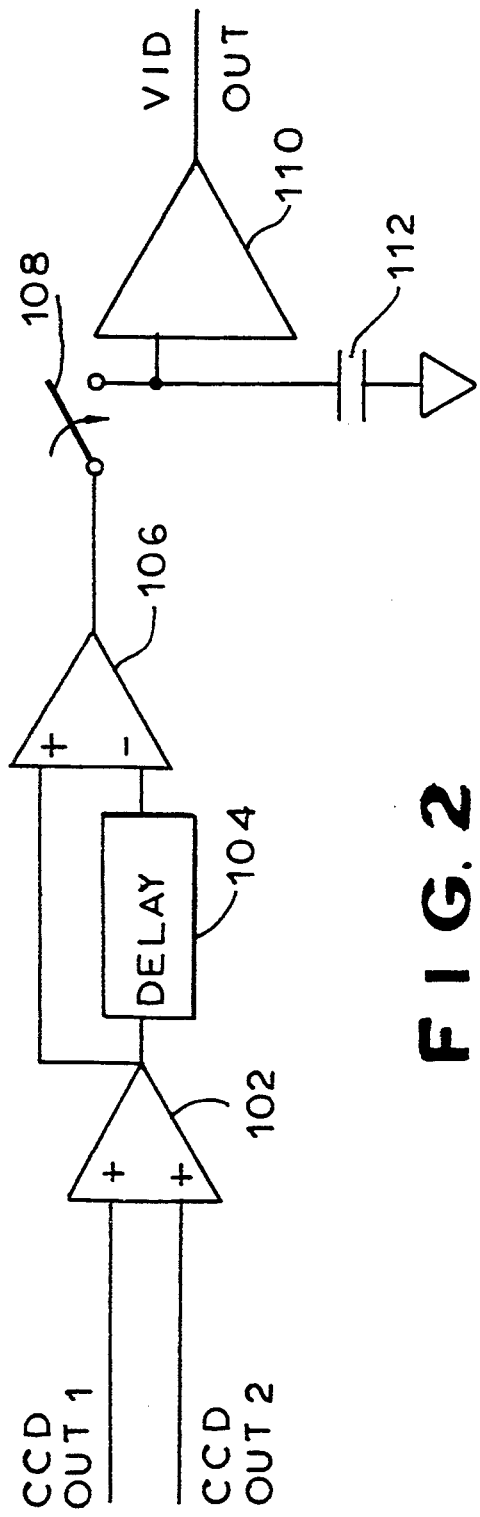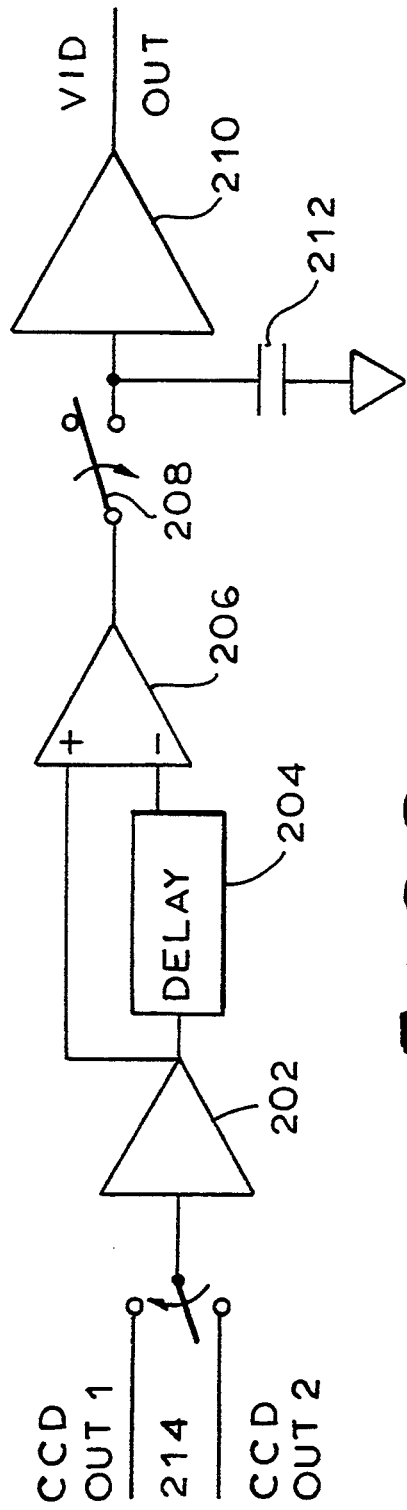
F I G. 2
F I G. 3

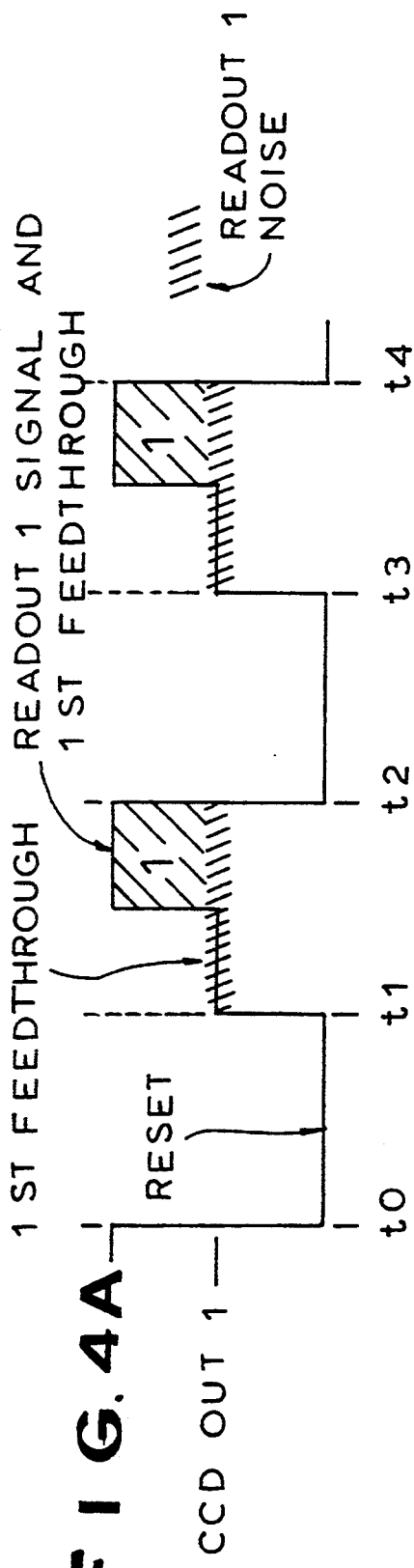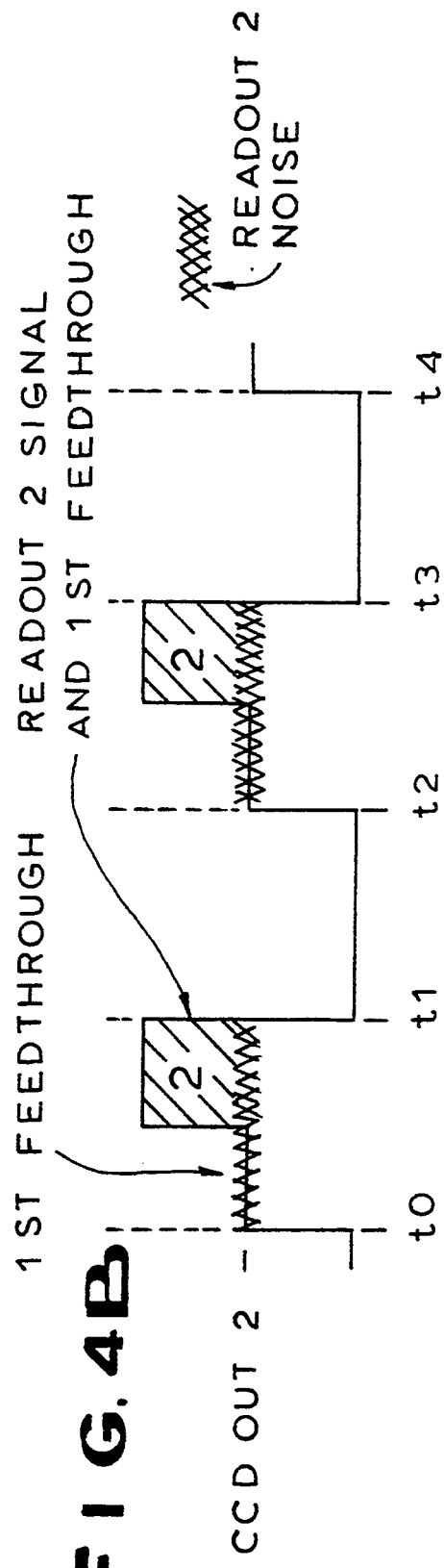

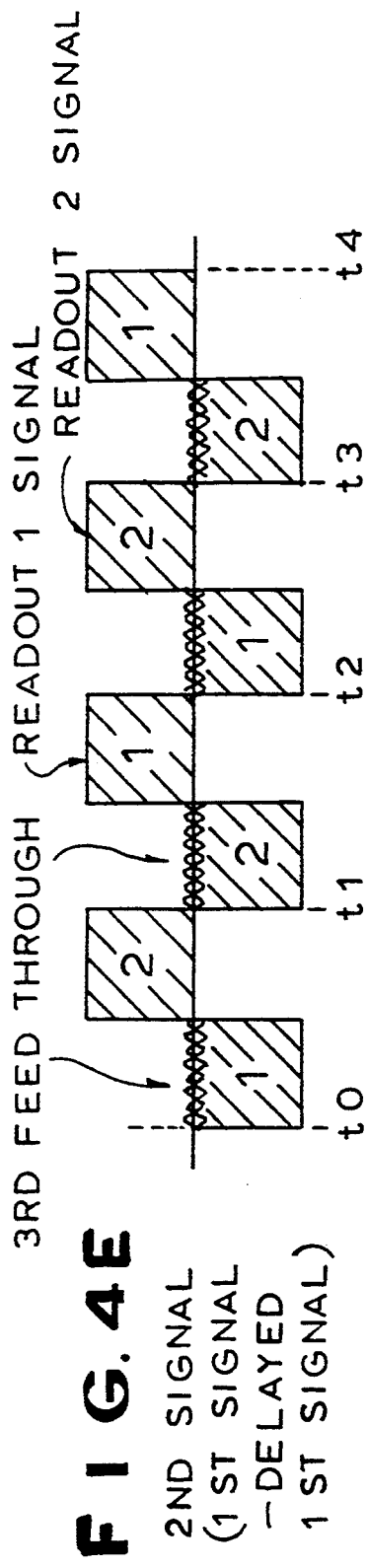
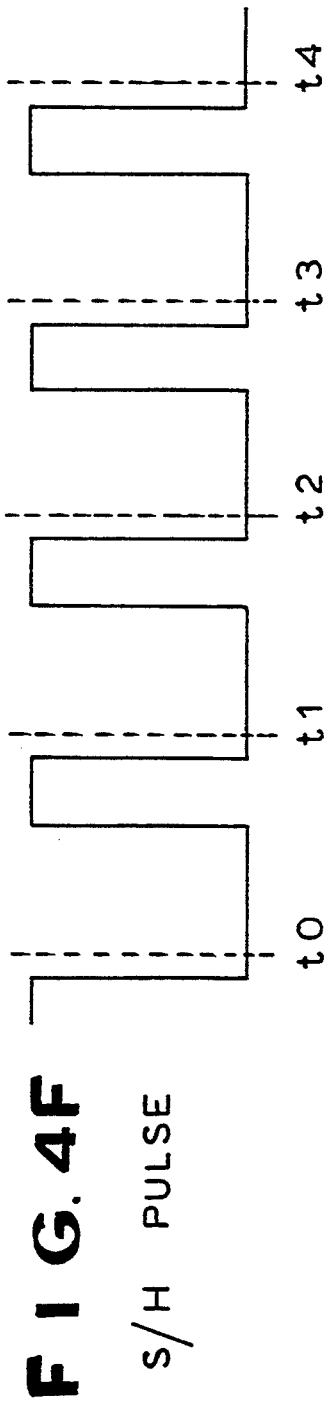
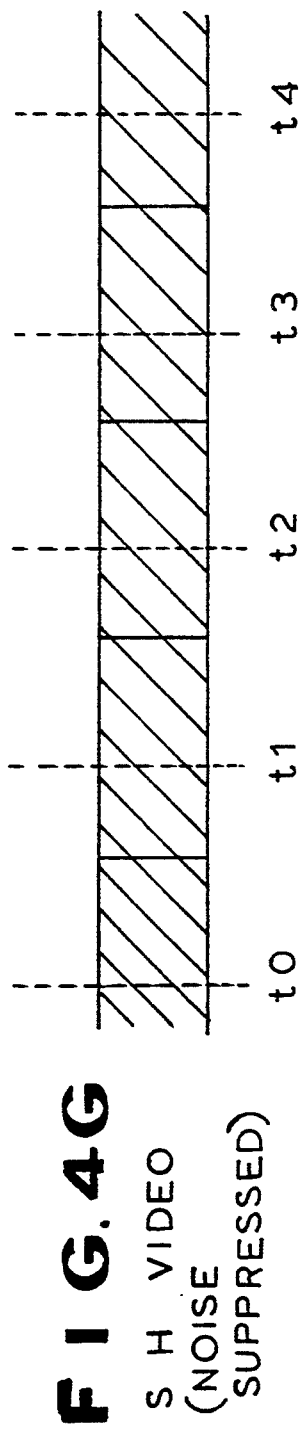
FIG. 4E  2ND SIGNAL (1ST SIGNAL — DELAYED 1ST SIGNAL)
FIG. 4F  S/H PULSE
FIG. 4G  S H VIDEO (NOISE SUPPRESSED)

MULTIPLEXED NOISE SUPPRESSION SIGNAL RECOVERY FOR MULTIPHASE READOUT OF CHARGE DEVICE ARRAYS

This is a continuation of application Ser. No. 07/828,726, filed on Jan. 31, 1992, now abandoned.

BACKGROUND OF THE INVENTION

1. Field of Invention

This invention relates generally to signal recovery from an array of charge coupled devices, and more particularly, to an apparatus and method for eliminating the need for multiple noise reduction channels for signal recovery from charge coupled devices having multiphase outputs.

2. Description of the Prior Art

Charge coupled devices (CCDs) can be used to form the light sensitive portion of a television camera. Such applications have been discussed in the literature widely, for example see "Charge Transfer Devices" by Sequin and Tompsett, Academic Press, Inc. 1975. In the television camera, a system of lenses focuses the light associated with the image onto CCDs. The CCDs converts light impulses into electrical impulses representative of the brightness of the image. The electrical impulses are generated for each particular location of each CCD element. The stream of electrical impulses emanating from the CCD is subsequently manipulated to transmit a serial train of electrical pulses descriptive of the image to which the CCDs were originally exposed via the system of lenses of the television camera.

A major problem involved with the operation of CCDs results from the contamination of tile output signal with clock feedthrough and several forms of noise. Clock feedthrough causes frequency components of the clock signals to appear in the output signal. Although, strictly speaking, clock feedthrough is not noise since it is a deterministic process, for present purposes, all sources of signal contamination including clock feedthrough will be referred to as noise. Other types of noise present in the output signal of a charge transfer device are so-called "1/f" noise characterized by an additive noise with high power at lower frequencies and lower power at high frequencies of a signal, and reset noise from the charging of the floating diffusion capacity.

Several schemes have been suggested for reducing or removing noise from the output signal produced by a CCD. These schemes involve some method for separately generating a "noise" signal that is similar and preferably identical to the noise present in the output signal from the device. The separately generated noise signal is then subtracted from the output signal of the device to yield a relatively noise-free output signal.

An example of a noise reduction method is the reflection-delayed noise suppression (RDS) method. This method can, with a delay line alone, determine the difference between the feedthrough level and the signal level of the CCD output signal, detect the signal component, and suppress the noise component. Another method for noise reduction similar to the RDS method is the DDS method. Here, a switch applies clamp pulses at the proper time to reduce noise.

Because of the large number of pixels required by HDTV, many CCDs currently have two phase outputs. A problem with both the RDS and DDS methods is that each CCD output related to each phase of a two phase, or multiphase, CCD must be processed independently through a separate and duplicative set of parts making up the RDS or DDS noise reduction circuits. For example, DDS noise suppression for a two phase CCD requires two buffers, two delay lines, two differential amplifiers, and two sample and hold circuits. The RDS parts count for a two phase CCD is similarly duplicative. This requirement of duplicate parts for each phase of the CCD requires the use of a large number of parts to accomplish the noise reduction function associated with the RDS and DDS methods with multiphase CCDs. A typical circuit of the prior art showing the use of the RDS method with a CCD having two phases is shown in FIG. 1.

It is therefore an objective of the present invention to perform a noise reduction function on multiple phased outputs of CCD devices using a minimal number of components.

It is a further objective of the present invention to increase the reliability of noise reduction circuitry by reducing overall parts count associated with that function.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE INVENTION

According to the invention, a multi-phase charge coupled device CCD array system includes a noise suppression, signal recovery circuit for use with the array of charge coupled devices having a plurality of phased readouts. The noise suppression signal recovery circuit combines a plurality of phased readouts into a first signal, delays the first signal with respect to itself so as to create a delayed first signal, subtracts the delayed first signal from the original (non-delayed) first signal to obtain a second signal, and samples the second signal to create a single signal representative of information contained in the plurality of phased readouts. The plurality of phased readouts can be combined using a summing amplifier or other comparable device, for example, a multiplexing switch, connected to the plurality of phased readouts.

In a specific embodiment of the invention where there are two phased readouts from the CCD array, the noise suppression, signal recovery circuit includes: a summing amplifier having two inputs and a first output, a delay line, a differential amplifier having a non-inverting input, an inverting input, and a second output, a sample and hold switch, and a sample and hold capacitor and buffer. The two phased readouts from the CCD array are connected to the two inputs of the summing amplifier, the output of which is connected to the delay line and the inverting input of the differential amplifier. The output of the delay line is connected to the non-inverting input of the differential amplifier. The output of the differential amplifier is connected to one end of the sample and hold switch, while the sample and hold capacitor and buffer are connected to the other end.

In actual operation, the circuit of the present invention time multiplexes the information contained in multiple phases generated by the charge coupled devices. This is possible because the typical waveforms output by charge coupled arrays generally contain useful information only during part of their total duration. Using this waveform characteristic, along with the novel circuit structure described herein, the summing amplifier, or its equivalent, combines the information contained in multiple waveforms into a summed, single waveform. This single waveform is processed through a noise reduction circuit containing the delay line and subsequently sampled by the sample and hold switch, buffer and capacitor to exclude those portions of the combined waveform that are no longer of value, e.g., do not contain useful information. This overall operation is done by using fewer components as compared to the prior art.

BRIEF DESCRIPTION OF THE DRAWINGS

FIG. 2 shows a first embodiment of the present invention wherein two signals CCD OUT1 and CCD OUT2 (generated by a CCD array having a two phased output) are concurrently processed for noise suppression by the use of a summer;

FIG. 3 shows a second embodiment of the present invention wherein two signals CCD OUT1 and CCD OUT2 (generated by a CCD array having a two phased output) are concurrently processed for noise suppression by the use of a multiplexer; and FIG. 4A through 4G show the timing diagram of the signals processed by the circuits shown in FIGS. 2 and 3.

DESCRIPTION OF THE PREFERRED EMBODIMENT

Figure 1:
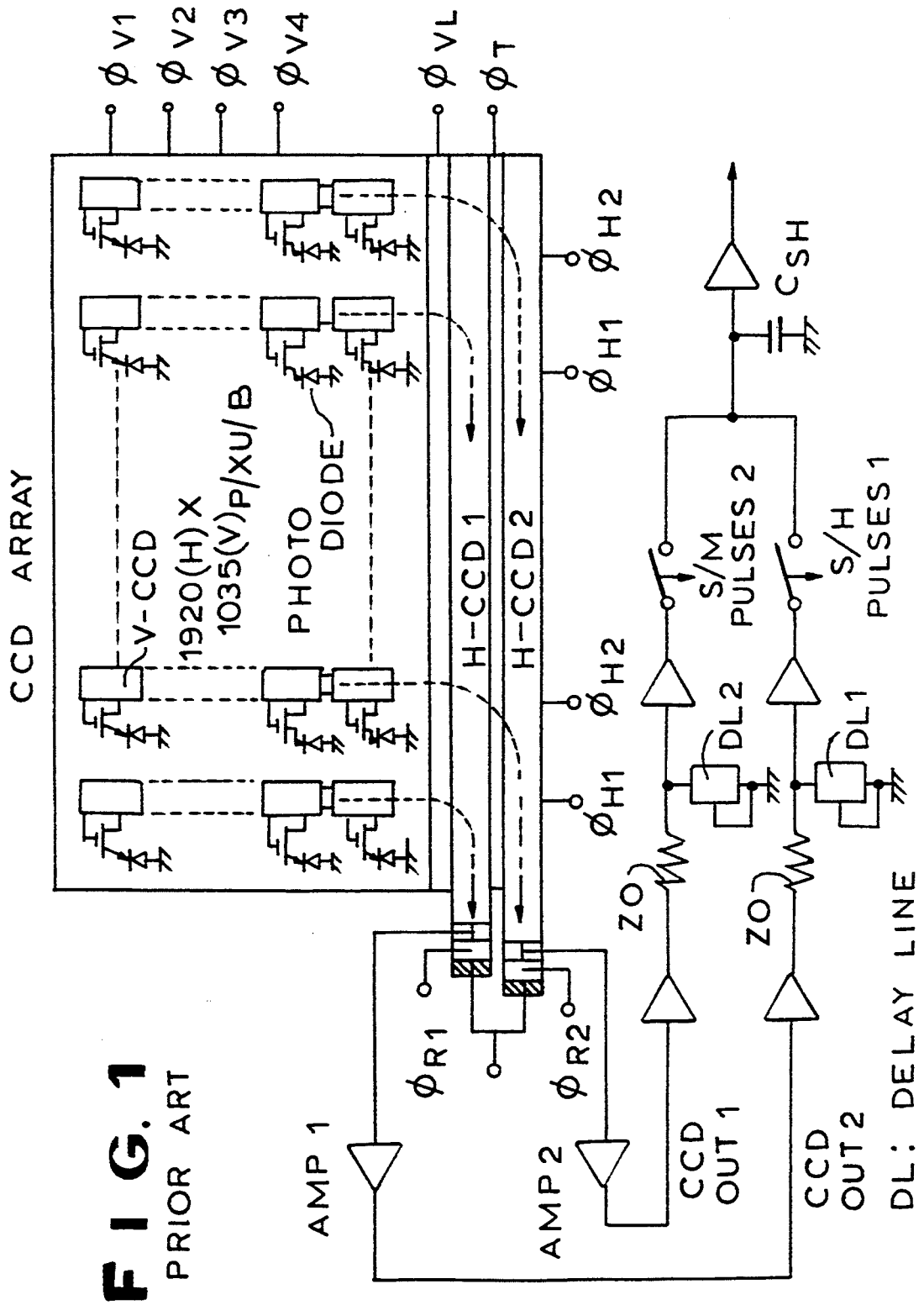
FIG. 1 shows the prior art of noise suppression circuits used in the RDS method for signal recovery.

FIG. 1 shows a prior art system for connecting two outputs associated with a two phase 1920 by 1035 pixel CCD array to two separate RDS type noise suppression circuits. For each of the CCD OUT1 and CCD OUT2 outputs from the CCD array, a delay line, sample and hold as well as a buffer amplifier are duplicated.

FIG. 2 shows a first embodiment of the present invention. Here, the CCD OUT1 and CCD OUT2 outputs from the CCD array are fed to a summing amplifier 102. The sum of the two signals from amplifier 102 are channeled into two paths. The first path is via delay 104 to the inverting (or subtracting) input of differential amplifier 106. The other path is directly to the non-inverting (or summing) input of differential amplifier 106. The output of amplifier 106 is sampled with sample and hold combination of switch 108, capacitor 112, and amplifier 110. The sampling rate of switch 108 is at twice the typical sampling frequency of 37.125 Mhz for a 1920 (horizontal) by 1035 (vertical) pixel array. That is, in the present invention the sampling rate (fs) of switch 108 is at 74.250 Mhz. Because of this configuration, the two signals containing the video information, i.e., the two phased outputs CCD OUT1 and CCD OUT2, are now combined in a single, noise suppressed video signal, VID OUT, descriptive of both signals. VIDOUT is a noise suppressed signal equivalent to the one output from the prior art circuit, but is obtained with fewer parts.

Another way of combining the two signals from the phased array, CCD OUT1 and CCD OUT2 is shown in FIG. 3. Here, for the same array previously discussed, sampling switch 214 operating at a frequency of 37.125 Mhz provides essentially the same summing function performed in FIG. 2 by summer 102. Switch 214 in conjunction with buffer amplifier 202 output a signal that is channeled into two paths. The first path is via delay 204 to the inverting (or subtracting) input of differential amplifier 206. The other path is directly channeled to the non-inverting (or summing) input of differential amplifier 206. The output of amplifier 206 is sampled with sample and hold combination of switch 208, capacitor 212, and amplifier 210. The sampling rate of switch 208 is at twice the typical sampling frequency of 37.125 Mhz for a 1920 (horizontal) by 1035 (vertical) of the pixel array. That is, in the present invention the sampling rate (fs) of switch 208 is at 74.250 Mhz. Because of this configuration, the two signals containing the video information, i.e., the two phased outputs CCD OUT1 and CCD OUT2, are now combined in a single, noise suppressed video signal, VID OUT, descriptive of both signals. VID OUT is a noise suppressed signal equivalent to the one generated from the prior art duplicative circuits.

The timing of the various signals used in both FIGS. 2 and 3 are similar, and are shown in FIG. 4. Here, the phasing of signal CCD OUT1 shown in FIG. 4A can be contrasted with signal CCD OUT2, shown in FIG. 4B. FIG. 4A details the output waveform of the phased readout of CCD OUT1. Illustrated therein are the reset interval, first feedthrough interval, and signal plus first feedthrough interval. It is to be noted that the noise that the noise found in the FIG. 4A waveform is particular to CCD OUT1 only. FIG. 4B provides the output waveform of CCD OUT2, which correspondingly contains noise which is particular to the CCD OUT2. The active portion of signal CCD OUT1 occurs between times t1 and t2, and again between times t3 and t4. Conversely, the active time of signal CCD OUT2 occurs between times t0 and t1 and again between times t2 and t3.

Figure 4C:
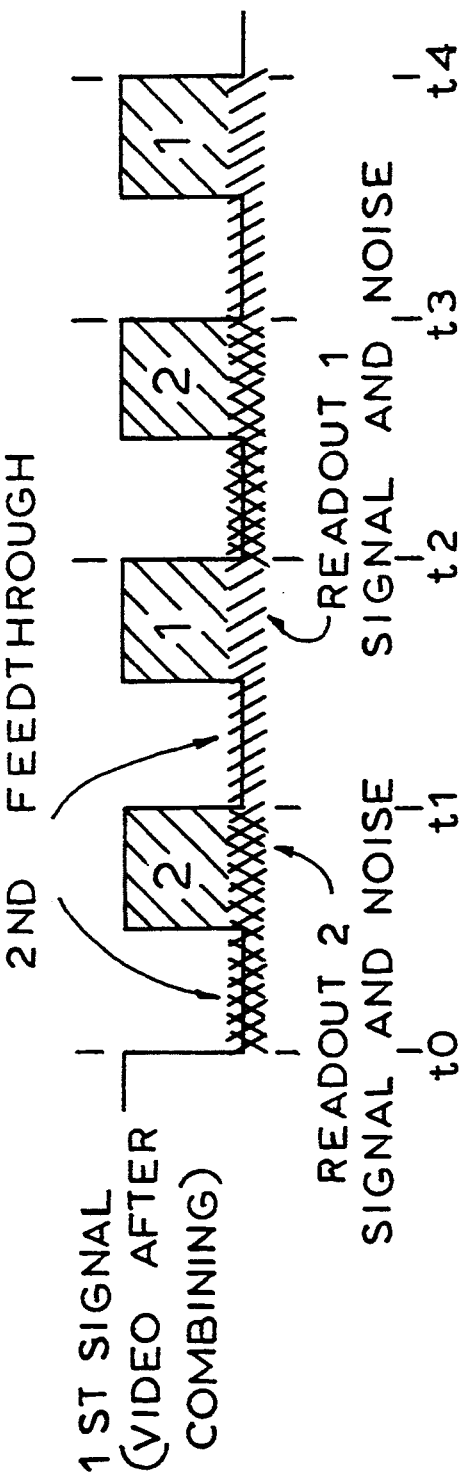
Figure 4D:
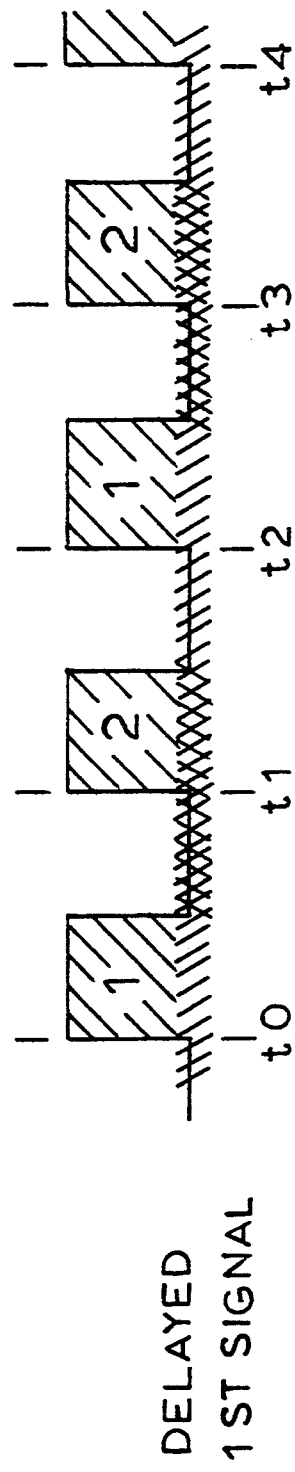

The output after summer 102 in FIG. 2 or multiplexing switch 214 in FIG. 3 is shown in FIG. 4C. FIG. 4C shows the waveform resulting from the combination of the CCD OUT1 and CCD OUT2 signals. The FIG. 4C waveform is designated as the "first signal" as recited in the appended claims. The first signal contains both CCD OUT1 and CCD OUT2 video information intervals and second feedthrough intervals. The second feedthrough intervals contain the noise signal from either CCD OUT1 or CCD OUT2. The input the delayed combination signal, provided to the inverting input of the differential amplifier 106 in FIG. 2 and differential amplifier 206 in FIG. 3 is shown in FIG. 4D. FIG. 4D shows the delayed first signal, wherein the noise from each feedthrough interval is properly aligned with its respective information plus noise interval. FIG. 4E provides the second signal resulting from the delayed first signal being subtracted from the undelayed first signal. The resulting second signal contains the noise suppressed information signal components and third feedthrough intervals. The third feedthrough intervals are comprised of noise and inverted signal information from the opposing CCD outputs. In FIG. 4F, the phased sample and hold pulse is illustrated. As aligned to the second signal (i.e., phased switching action of switch 108 and 208 at N times the data rate, as discussed above), only the noise suppressed information intervals are sampled, resulting in the sampled and held noise suppressed output signal illustrated in FIG. 4G.

In FIG. 3, the phasing of the switching action of switch 214 is chosen to correspond to the active portion of signals CCD OUT1 and CCD OUT2. That is, the switch 214 should be connected to CCD OUT1 during times t1 through t2 and t3 through t4, while the same switch 214 should be connected to signal CCD OUT2 during times t0 through t1 and t2 through t3.

The time delays introduced by delays 104 in FIG. 2 and 204 in FIG. 3 equal one half the time between t0 and t1. For example, for an operating frequency fs of 74.250 Mhz, the delay is 6.734 nanoseconds.

This concept can be extended further to encompass an N phased CCD array output by using the principles shown for the two phase solution. For an N phased output, the sampling frequency for the sample and hold switch 108 in FIG. 2 and 208 in FIG. 3 is equal to N times the rate at which the data appears at each of the N phases of the CCD array. Furthermore, the switching rate of the input multiplexing switch 214 in FIG. 3 is also N times the data rate of each of the N phases of the display, with the phasing of the switching action timed so as to correspond to the active time of each of the N input signals. The delay of elements 104 in FIG. 2 or 204 in FIG. 3 is equal to the length of the active time of each output phase divided by the number of phases, N. For example, the active time in FIG. 4A for signal CCD OUT1 is the time t1 to t2. In an N phase array, the active time t1 to t2 would not be one half of the overall repeating cycle defined from time t0 to t3, but rather a fraction 1/N of the overall repeating cycle.

Generally, the above invention is used in conjunction with video cameras. In video cameras, the light making up an image is focused onto the array of charge coupled devices having a plurality of phased readouts. The output from these multiple phased readouts is combined in accordance with the present invention to create a single signal representative of the image "seen" by the CCD array. This single signal is further processed by amplification and conversion into a voltage and impedance level that allows it to be used by other video equipment such as video recorders, video transmitters, etc.

Although the present invention has been shown and described with respect to preferred embodiments, various changes and modifications which are obvious to persons skilled in the art of which the invention pertains are deemed to lie within the spirit and scope of the invention. Thus numerous changes and modifications can be made while staying within the scope of the invention which is set forth in the appended claims.

We claim:

1. A non-bandlimiting, random and fixed noise suppression, signal recovery circuit for use with an array of charge coupled devices, said array having a plurality of phased readouts each having active signal intervals, comprising signal information, and first feedthrough time intervals, comprising:

means for selectively combining said plurality of phased readouts into a first signal including all signal information from said active signal intervals of said plurality of phased readouts, wherein said first signal comprises information intervals having information and noise signal components and second feedthrough time intervals having noise signal components;

means for delaying said first signal with respect to itself, so as to create a delayed first signal;

means for subtracting said delayed first signal from said first signal whereby said noise signal components of said second feedthrough time intervals are subtracted from said information intervals having information and noise signal components to obtain a second signal comprising information intervals having information signal components and third feedthrough time intervals; and means for sampling said second signal at a sampling rate adapted to eliminate said third feedthrough time intervals thereby obtaining a single random and fixed noise suppressed signal representative of said plurality of phased readouts.

2. A noise suppression, signal recovery circuit for use with a charge coupled device having a plurality of phased readouts of claim 1 wherein said means for selectively combining said plurality of phased readouts is a summing amplifier.

3. A noise suppression, signal recovery circuit for use with a charge coupled device having a plurality of phased readouts of claim 1 wherein said means for selectively combining said plurality of phased readouts is a switch that alternately connects to each phased readout constituting said plurality of phased readouts.

4. A method for providing non-bandlimiting, random and fixed noise suppression, signal recovery for use with an array of charge coupled devices, said array having a plurality of phased readouts each having active signal intervals, comprising signal information, and first feedthrough time intervals, comprising:

selectively combining said plurality of phased readouts into a first single signal, including all signal information from said active signal intervals of said plurality of phased readouts, wherein said first signal comprises information intervals having information and noise components and second feedthrough time intervals having noise components;

delaying said first signal with respect to itself, so as to create a delayed first signal;

subtracting said delayed first signal from said first signal whereby said noise components of said second feedthrough time intervals are subtracted from said information intervals having information and noise components to obtain a second signal comprising information intervals having information signal components and third feedthrough time intervals; and sampling said second signal at a sampling rate adapted to eliminate said third feedthrough time intervals thereby obtaining a single random and fixed noise suppressed signal representative of said plurality of phase readouts.

5. A non-bandlimiting, random and fixed noise suppression, signal recovery circuit operating with respect to a reference potential, for use with a charge coupled array having two phased readouts, said readouts including active signal intervals, having signal information, and first feedthrough time intervals, comprising:

a summing means having two inputs and a first output, for selectively combining said two phased readouts into a first signal including all signal information from said active signal intervals, whereby said first signal comprises information intervals having information and noise signal components and second feedthrough time intervals having noise signal components;

a delay line, for delaying said first signal with respect to itself thereby creating a first delayed signal;

a differential amplifier having a non-inverting input, an inverting input, and a second output;

a sample and hold switch;

a capacitor; and a sample and hold buffer having a third input, wherein said two phased readouts are connected to said two inputs of said summing means, said delay line is connected between said first output of said summing means and said inverting input of said differential amplifier, said first output of said summing means is connected to said non-inverting input of said differential amplifier, whereby said first delayed signal is subtracted from said first signal, thereby providing a second signal at said second output, said second signal having information intervals and third feedthrough time intervals, said sample and hold switch is connected between said second output and said third input of said sample and hold buffer, for sampling said second signal at a sampling rate adapted to eliminate said third feedthrough time intervals and said capacitor is connected between said sample and hold buffer third input and said reference potential.

6. A noise suppression, signal recovery circuit operating with respect to a reference potential, for use with a charge coupled array having two phased readouts of claim 5 wherein said summing means is a summing amplifier.

7. A noise suppression, signal recovery circuit operating with respect to a reference potential, for use with a charge coupled array having two phased readouts of claim 5 wherein said summing means is a switch alternately connected to said two phased readouts.

8. A video system for the acquisition of visual images comprising:

an array of charge coupled devices, said array having a plurality of phased readouts having active signal intervals comprising signal information and first feedthrough time intervals;

optical means for focusing light onto said array of charge coupled devices;

means for selectively combining said plurality of phased readouts into a first signal including all signal information from said active signal intervals of said plurality of phased readouts, wherein said first signal comprises information intervals having information and noise components and second feedthrough time intervals having noise components;

means for delaying said first signal with respect to itself, so as to create a delayed first signal;

means for subtracting said delayed first signal from said first signal whereby said noise components of said second feedthrough time intervals are subtracted from said information intervals having information and noise components to obtain a second signal comprising information intervals having information components and third feedthrough time intervals;

means for sampling said second signal at a sampling rate adapted to eliminate said third feedthrough time intervals thereby obtaining a single, random and fixed noise suppressed signal representative of the full bandwidth of said plurality of phased readouts; and signal processing means for amplifying and converting said single, random and fixed noise suppressed signal representative of the full bandwidth of said plurality of phased readouts to a compatible video signal.

9. A video system as described in claim 8 wherein said means for combining said plurality of phased readouts is a summing amplifier.

10. A video system as described in claim 8 wherein said means for combining said plurality of phased readouts is a switch that alternately connects to each phased readout constituting said plurality of phased readouts.

* * * * *